United States Patent
Kamieniecki et al.

(10) Patent No.: US 6,388,455 B1
(45) Date of Patent: May 14, 2002

(54) METHOD AND APPARATUS FOR SIMULATING A SURFACE PHOTO-VOLTAGE IN A SUBSTRATE

(75) Inventors: Emil Kamieniecki, Lexington; Krzysztof E. Kamieniecki, Cambridge; Jeffrey L. Sauer, Danvers; Janusz Butkiewicz, Chelmsford, all of MA (US)

(73) Assignee: QC Solutions, Inc., North Billerica, MA (US)

( * ) Notice: Subject to any disclaimer, the term of this patent is extended or adjusted under 35 U.S.C. 154(b) by 0 days.

(21) Appl. No.: 09/483,138

(22) Filed: Jan. 13, 2000

Related U.S. Application Data
(60) Provisional application No. 60/115,852, filed on Jan. 13, 1999.

(51) Int. Cl.[7] ............................................. G01R 31/302
(52) U.S. Cl. ..................................................... 324/752
(58) Field of Search ........................ 324/752, 765, 324/750; 250/492.1, 492.2

(56) References Cited

U.S. PATENT DOCUMENTS

| | | | |
|---|---|---|---|
| 4,286,215 A | 8/1981 | Miller .................... | 324/158 R |
| 4,333,051 A | 6/1982 | Goodman ............... | 324/158 R |
| 4,433,288 A | 2/1984 | Moore .................... | 324/158 D |
| 4,544,887 A | 10/1985 | Kamieniecki .......... | 324/158 R |
| 4,663,526 A | 5/1987 | Kamieniecki .......... | 250/315.3 |
| 4,827,212 A | 5/1989 | Kamieniecki .......... | 324/158 R |
| 4,891,584 A | 1/1990 | Kamieniecki .......... | 324/158 R |
| 5,025,145 A | 6/1991 | Lagowski ................ | 250/211 J |
| 5,087,876 A | 2/1992 | Reiss et al. ............. | 324/158 D |
| 5,091,691 A | 2/1992 | Kamieniecki et al. .. | 324/158 R |
| 5,159,409 A * | 10/1992 | Coneski et al. .......... | 356/394 |
| 5,177,351 A | 1/1993 | Lagowski ................. | 250/215 |
| 5,369,495 A | 11/1994 | Lagowski ................. | 356/418 |
| 5,661,408 A | 8/1997 | Kamieniecki et al. .... | 324/765 |
| 5,663,657 A | 9/1997 | Lagowski et al. ........ | 324/766 |
| 5,751,159 A * | 5/1998 | Holm et al. .............. | 324/767 |
| 6,069,017 A | 5/2000 | Kamieniecki et al. .... | 438/17 |

FOREIGN PATENT DOCUMENTS

WO    WO 99/35677    7/1999

OTHER PUBLICATIONS

Nakhmanson, "Frequency Dependence of the Photo–EMF of Strongly Inverted Ge and Si MIS Structures—I. Theory", *Solid State Electronics*, vol. 18, 1975, pp. 617–626.

Nakhmanson et al., "Frequency Dependence of Photo–EMF of Strongly Inverted Ge and Si MIS Structures—II. Experiments", *Solid State Electronics*, vol. 18, 1975, pp. 627–634.

Streever et al., "Photovoltage Characterization of MOS Capacitors", *Proc. Int. Symp. Silicon Materials Sci. & Tech.*, Philadelphia, May 1977, (Electrochem. Soc. Princeton, 1977) pp. 393–400.

Sher et al., "Si and GaAs Photocaptive MIS Infrared Detectors", *J.Appl. Phys.*, vol. 51, No. 4, Apr. 1980, pp. 2137–2148.

(List continued on next page.)

*Primary Examiner*—Safet Metjahic
*Assistant Examiner*—Etienne P LeRoux
(74) *Attorney, Agent, or Firm*—Testa, Hurwitz & Thibeault, LLP

(57) ABSTRACT

This invention relates to a method and apparatus for simulating a surface photo-voltage, more particularly with a photodiode on a process sized disk for calibrating surface photo-voltage measurement devices. The device for simulating a surface photo-voltage includes the photodiode, the disk, a resistor, and may further include an operational amplifier. The apparatus for simulating a surface photo-voltage of the current invention facilitates calibration of surface photo-voltage measurement devices by using a process sized disk to fit directly on a surface photo-voltage measurement chuck.

27 Claims, 7 Drawing Sheets

OTHER PUBLICATIONS

Munakata et al., "Non–Destructive Method of Observing Inhomogeneities in p–n Junctions with a Chopped Photon Beam", *Jpn. J. Appl. Phys.*, vol. 20, No. 2, Feb. 1981, pp. L137–L140.

Kamieniecki, "Determination of Surface Space Charge Using a Light Probe", *J.Vac. Sci. Technol.*, vol. 20, No. 3, Mar. 1982, pp. 811–814.

Kamieniecki et al., "Characterization of Semiconductor–Electrolyte System by Surface Photovoltage Measured Capacitance", *164th Meeting of the Electrochemical Society*, Washington, D.C., Oct. 1983.

Kamieniecki, "Surface Photovoltage Measured Capacitance : Application To Semiconductor/Electrolyte System",*J.Appl. Phys.*, vol. 54, No. 11, Nov. 1983, pp. 6481–6487.

Engstrom et al., "Scanned Light Pulse Technique for the Investigation of Insulator–semiconductor Interfaces", *J.Appl. Phys.*, vol. 54, No. 9, Sep. 1983, pp. 5245–5251.

Munakata et al., "AC Surface Photovoltages in Strongly–Inverted Oxidized p–Type Silicon Wafers",*Jpn. J. Appl. Phys.*, vol. 23, No. 11, Nov. 1984, pp. 1451–1461.

Thorngreen et al., "An Apparatus for the Determination of Ion Drift in MIS Structures", *J. Phys. E: Sci. Instrum.*, vol. 17, 1984, pp 1114–1116.

Munakata et al., "Analysis of AC Surface Photovoltages in a Depleted Oxidized p–Type Silicon Wafer", *Jpn. J. Appl. Phys.*, vol. 25, No. 6, Jun. 1986, pp. 807–812.

Chang et al., "Remote Gate Capacitance–Voltage Studies for Noninvasive Surface Characterization", *Appl. Phys. Lett.*, vol. 51, No. 13, Sep. 28, 1987, pp. 987–989.

Shimizu et al., "Determination of Surface Charge and Interface Trap Densities in Naturally Oxidized n–Type Si Wafers Using AC Surface Photovoltages", *Jpn. J. Appl. Phys.*, vol. 26, No. 2, Feb. 1987, pp. 226–230.

Kamieniecki, "Surface Charge Analysis: A New Method to Characterize Semiconductor/Insulator Structures—Application to Silicon/Oxide System", *Proceedings of the 1st International Symposium on Cleaning Technology in Semiconductor Device Manufacturing*, Hollywood, Florida, Oct. 1989, vol. 90–9, pp. 273–279.

Lagowski et al., "Non–contact Mapping of Heavy Metal Contamination for Silicon IC Fabrication", *Semicond. Sci. Technol.*, vol. 7, 1992, pp. A185–A192.

Kamieniecki et al., "Analysis and Control of Electrically Active Contaminants by Surface Charge Analysis",*Handbook of Semiconductor Wafer Cleaning Technology*, Part IV–11, Ed. W. Kern, Noyes Publications (1993).

Sakai et al., "Non–contact, Eelctrode–free Capacitance/Voltage Measurement Based on General Theory of Metal–Oxide Semiconductor (MOS) Structure", *Jpn. J. Appl. Phys.*, vol. 32 Pt. 1, No. 9A, Sep. 1993, pp. 4005–4011.

Kamieniecki et al., "A New Method for In–line, Real–time Montiroing of Wafer Cleaning Operations", Presented during the *Symposium on Ultra Clean Processing of Silicon Surfaces*, UCPSS'94, Bruges, Belgium, Sep. 19–21, 1994.

* cited by examiner

METHOD AND APPARATUS FOR SIMULATING A SURFACE PHOTO-VOLTAGE IN A SUBSTRATE

RELATED APPLICATIONS

This application claims priority to provisional application U.S. Ser. No. 60/115,852 filed on Jan. 13, 1999.

FIELD OF THE INVENTION

This invention relates to a method and apparatus for diagnosing and monitoring a semiconductor based device, more particularly a surface photo-voltage in a substrate.

BACKGROUND OF THE INVENTION

Surface photo-voltage principles are an important tool used for characterizing semiconductor materials. In particular, devices applying surface photo-voltage principles are becoming one of the main technologies for non-contact diagnostics and monitoring procedures used in many manufacturing processes for silicon based devices.

A surface photo-voltage measurement method is disclosed in U.S. Pat. No. 4,544,887. In this method, a beam of light is directed at a region of a surface of a specimen of semiconductor material and a photo-induced change in electrical potential at the surface is measured. The wavelength of the illuminating light beam is selected to be shorter than the wavelength of light corresponding to the energy gap of the semiconductor material undergoing testing. The intensity of the light beam is modulated, with both the amplitude of the light and the frequency of modulation being selected such that the resulting AC component of the induced photo-voltage is directly proportional to the intensity of light and inversely proportional to the frequency of modulation.

A surface photo-voltage measuring system can be used for non-contact diagnostics and monitoring of silicon based devices. The surface photo-voltage measurement system includes a surface photo-voltage measurement probe located above a measurement chuck. A wafer to be evaluated with the surface photo-voltage measurement system is placed on the measurement chuck.

A critical element in the use of the surface photo-voltage measurement system is to ensure that the surface photo-voltage measurement system is properly measuring the surface photo-voltage of the wafer. In the past, reference wafers have been used to calibrate photo-voltage measurement systems. However, reference wafers do not provide consistent surface photo-voltage measurement due to the sensitivity of the reference wafers to ambient conditions. There is a need in the art for a device that can consistently calibrate surface photo-voltage measurement systems.

SUMMARY OF THE INVENTION

The present invention relates to an apparatus for simulating a surface photo-voltage in a semiconductor wafer. In one embodiment the apparatus includes a photodiode, a resistor, and a disk. The photodiode has an anode and a cathode. The resistor has a first terminal and a second terminal. The disk has a first surface and a second surface. The resistor first terminal is in electrical communication with either the photodiode anode or the photodiode cathode. The resistor second terminal is in electrical communication with the first surface of the disk and the photodiode anode if the photodiode cathode is connected to the resistor first terminal, or the photodiode cathode if the photodiode anode is connected to the resistor first terminal.

The disk is made from a conductive or semiconductive material. The disk can also be process sized to duplicate the normal size and weight of industry standard semiconductor wafers to evaluate a surface photo-voltage measurement system used in production.

In one embodiment of the present invention, the photodiode is a planar photodiode. In another embodiment of the present invention, the photodiode is a photodiode array including a plurality of individual photodiode segments. In yet another embodiment of the present invention, the individual photodiode segments are in electrical communication with one or more electrical resistors.

In another embodiment of the present invention, the apparatus further includes an operational amplifier having an first input terminal, a second input terminal, and an output terminal. The first input terminal is in electrical communication with either the photodiode anode or cathode, the second input terminal is in electrical communication with the other of the photodiode anode and cathode, and the output terminal is in electrical communication with the resistor second terminal.

The present invention also relates to an apparatus for measuring a simulated photo-voltage in a semiconductor wafer. In one embodiment the apparatus includes a photodiode, a resistor and a disk used for simulating a surface photo-voltage and further adds a measurement chuck comprising a first surface, a surface photo-voltage measurement probe, and a light source for measuring the simulated surface photo-voltage. In another embodiment the light source generates a light having amplitude modulation.

Another embodiment of the present invention further adds an optional optical window including an electrically conductive transparent coating. The optical window is positioned adjacent to the photodiode and between the photodiode and the light source.

The present invention also relates to a method for simulating a surface photo-voltage. In one embodiment the method includes providing an apparatus for generating a simulated surface photo-voltage including a simulator disk, generating a light from a light source, illuminating the simulator disk, and generating a signal in the simulator disk. In another embodiment, the method further includes providing a measurement chuck and a surface photo-voltage measurement probe, and measuring the signal with the surface photo-voltage measurement probe. In another embodiment, the method further includes providing an operational amplifier.

The present invention also relates to an apparatus for simulating a surface photo-voltage including a photodiode, a disk, and a resistor. The photodiode has a anode metalization and a cathode metalization. The disk has a trench. The resistor has a first and second terminal wherein the resistor first terminal is attached to the photodiode cathode metalization with a first volume of conductive epoxy and the second resistor terminal is attached to the photodiode anode metalization with a second volume of conductive epoxy.

The present invention also relates to an apparatus for simulating a surface photo-voltage including a photodiode, a resistor, an operational amplifier, and a disk. The photodiode has an anode and a cathode. The resistor has a first terminal and a second terminal. The operational amplifier has a first input terminal, a second input terminal, and an output terminal. The disk has a first surface. The resistor first terminal and operational amplifier first input terminal are in electrical communication with either the photodiode anode or cathode. The operational amplifier second input terminal is in electrical communication with the other of the photodiode anode or cathode, and the operation amplifier output terminal is in electrical communication with the resistor second terminal. The photodiode is mounted to the disk first surface but the photodiode is not in electrical communication with the disk.

BRIEF DESCRIPTION OF THE FIGURES

This invention is pointed out with particularity in the appended claims. The above and further advantages of this invention may be better understood by referring to the following description, taken in conjunction with the accompanying drawings, in which:

DESCRIPTION

Figure 1:
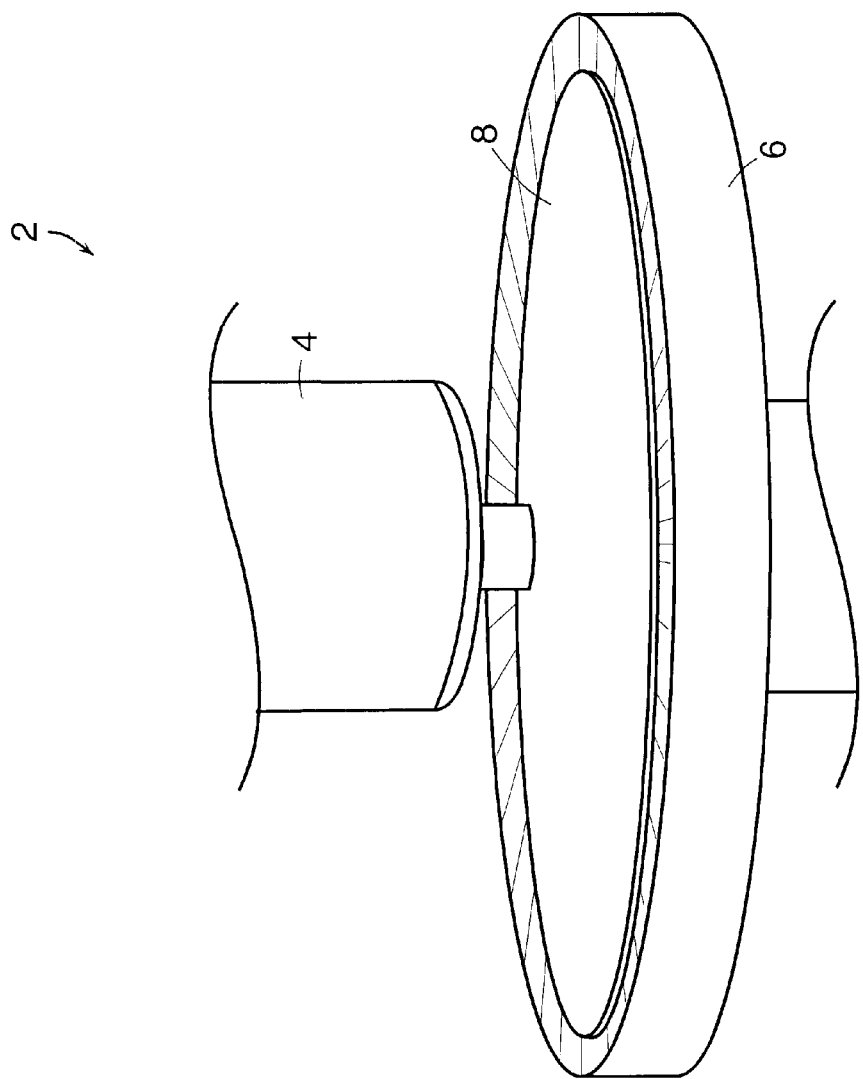
FIG. 1 is a perspective view of one embodiment of a surface photo-voltage measurement system.

FIG. 1 is a perspective view of one embodiment of a surface photo-voltage measurement system 2 for non-contact diagnostics and monitoring of semiconductor devices. The surface photo-voltage measurement device 2 includes a surface photo-voltage measurement probe 4 located above a measurement chuck 6. A wafer 8, to be evaluated with the surface photo-voltage measurement system 2, is placed on the measurement chuck 6. The wafer 8 may be transported to and from the measurement chuck 6 by any mechanical or robotic method or apparatus known by those skilled in the art.

Figure 2:
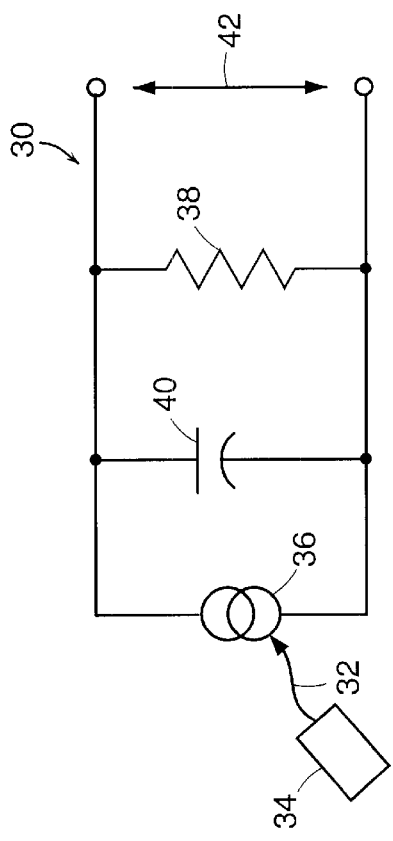
FIG. 2 is an equivalent circuit diagram for an embodiment of a surface photo-voltage detection system.

FIG. 2 illustrates an equivalent circuit 30 for an embodiment of a basic surface photo-voltage detection system. A light 32 from a light source 34 illuminates a photodiode 36. In practice there will be leakage from the photodiode 36. The leakage resistance can be represented in circuit 30 by a resistor 38 connected in parallel with a junction capacitor 40. As the light 32 is illuminated on the photodiode 36 a voltage 42 is generated across the circuit 30. In equivalent circuit 30 the entire photodiode 36 is illuminated.

Figure 3:
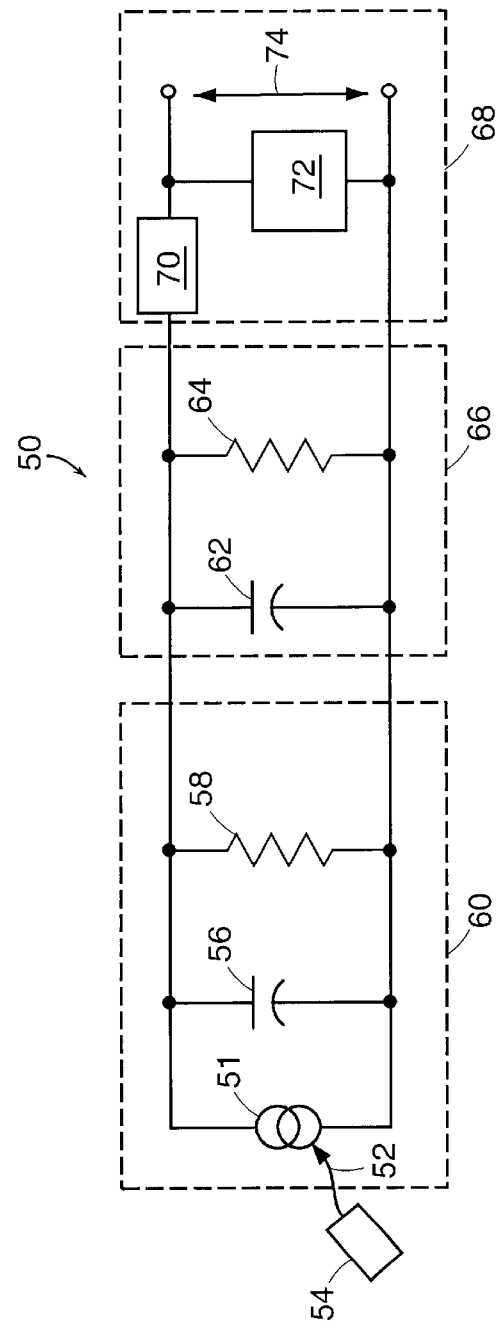
FIG. 3 is an equivalent circuit diagram for an embodiment of a surface photo-voltage detection system.

FIG. 3. illustrates an embodiment of an equivalent circuit 50 for an embodiment of a basic surface photo-voltage detection system where only a portion of the area of a photodiode 51 is illuminated by light 52. Equivalent circuit 50 includes an illuminated photodiode area 60 and non-illuminated photodiode area 66. The illuminated photodiode area 60 includes an equivalent capacitor 56 and an equivalent resistor 58. The non-illuminated photodiode area 66 includes an equivalent capacitor 62 and equivalent resistor 64. Equivalent circuit 50 also represents a surface photo-voltage measurement system 68 with an input impedance 70 and an impedance load 72 across the measurement system 68. In addition, there is a voltage 74 across the measurement system.

Figure 4:
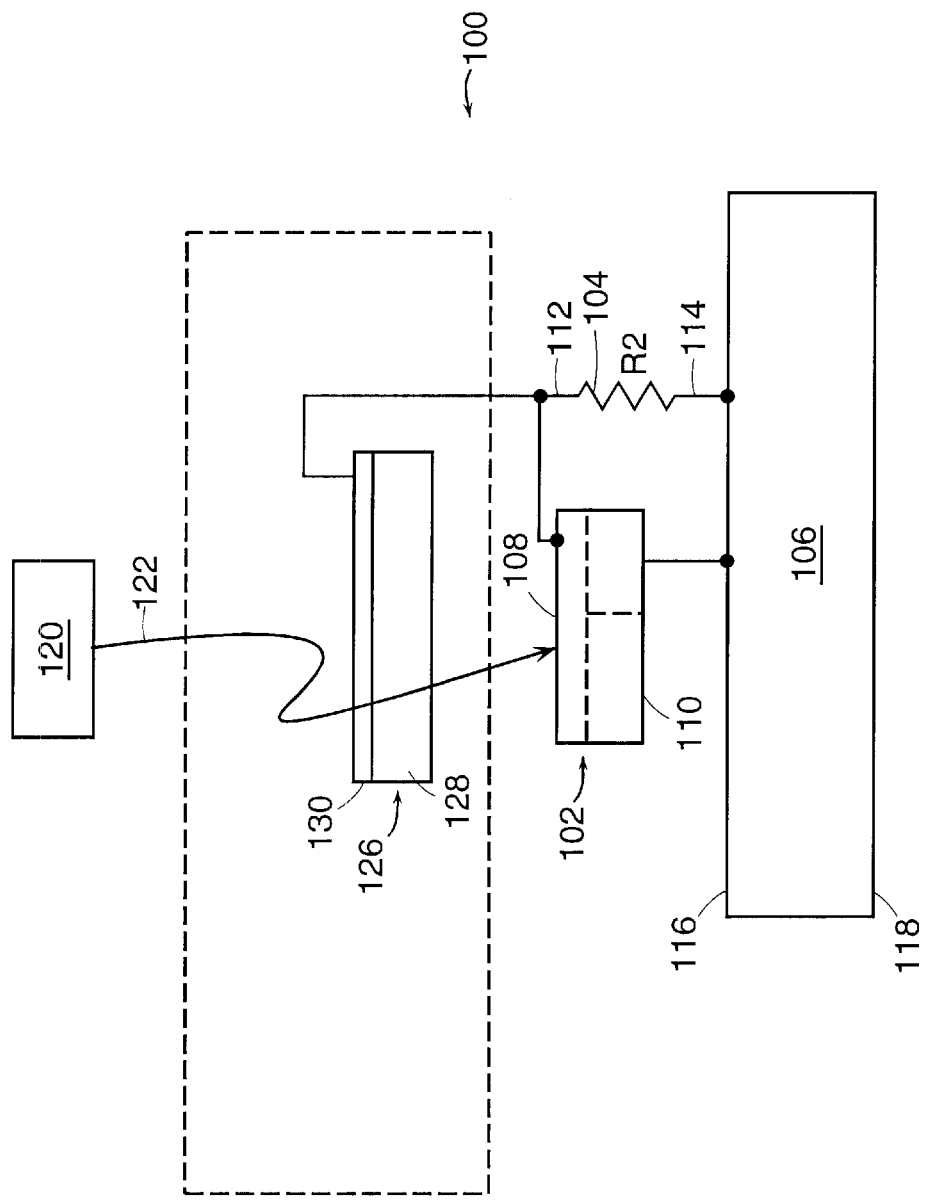
FIG. 4 is a schematic diagram of an embodiment of the simulation device.

FIG. 4 is a schematic diagram of an embodiment of the simulation device for simulating a surface photo-voltage in a wafer operating in a photo-voltaic mode. A simulation device 100 includes a photodiode 102, a resistor 104 and a disk 106. The photodiode 102 includes an anode 108 and a cathode 110. The resistor 104 includes a resistor first terminal 112 and a resistor second terminal 114. The resistor first terminal 112 is in electrical communication with the photodiode anode 108. In an alternative embodiment the photodiode 102 can be inverted and the resistor first terminal 112 can be in electrical communication with the photodiode cathode 110. The disk 106 includes a first surface 116 and a second surface 118. The disk first surface 116 is in electrical communication with the resistor second terminal 114 and the photodiode cathode 110. Light 122 from light source 120 illuminates the photodiode 102 to generate a surface photo-voltage. The disk second surface 118 of simulation device 100 is positioned on a measurement chuck (not shown in figure) of the surface photo-voltage measurement device 2 to generate a surface photo-voltage signal to calibrate the surface photo-voltage measurement device 2.

Optionally, an optical window 126 can be placed between the light source 120 and the photodiode 102. The optical window 126 includes a polished quartz substrate 128, with an electrically conductive, optically transparent coating 130. The electrically conductive optically transparent coating 130 can be Indium-Tin-Oxide. The optical window 126 can be used to filter the light 122 to the photodiode 102. The electrically conductive optically transparent coating 130 is in electrical communication with the resistor first terminal 112.

Figure 5:
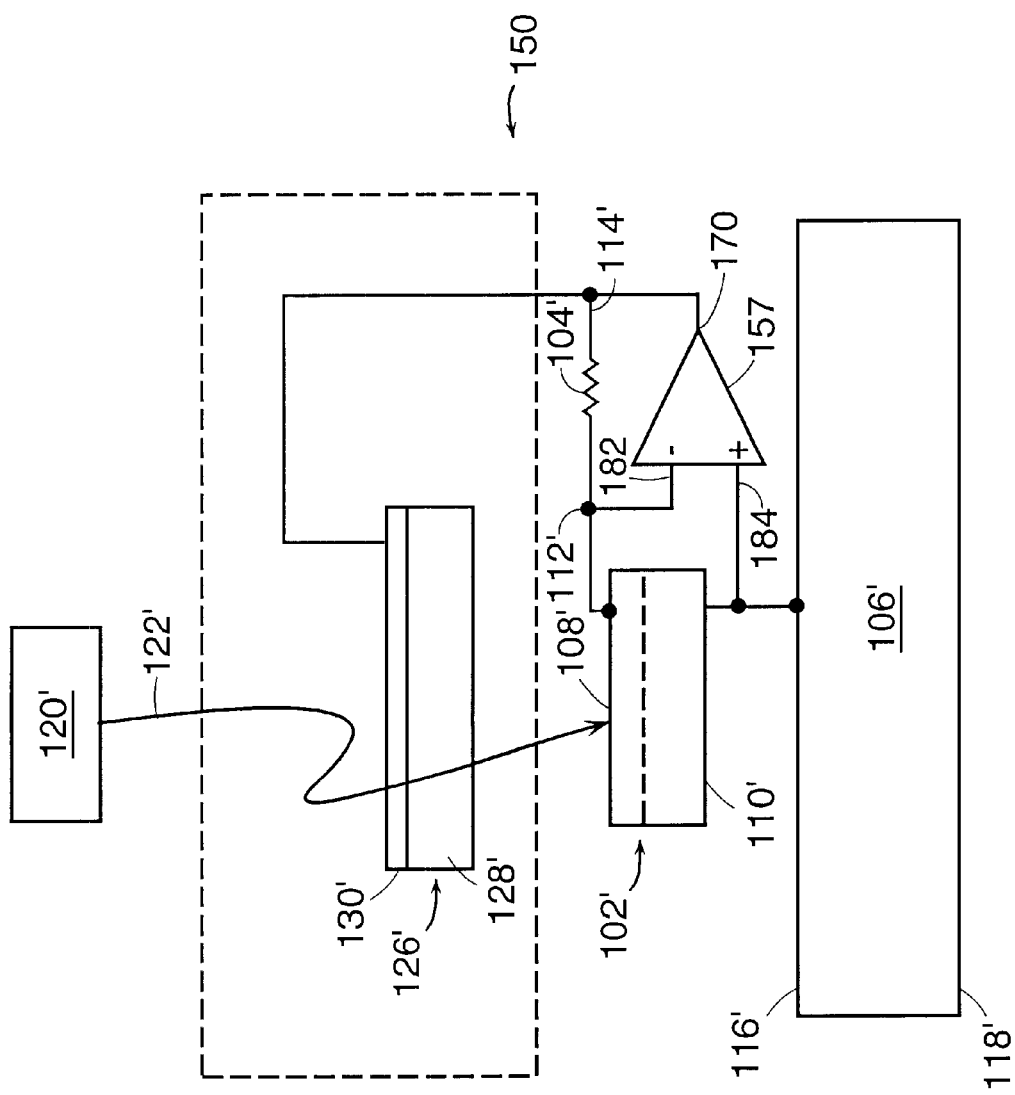
FIG. 5 is a schematic diagram of another embodiment of the simulation device.

FIG. 5 is a schematic diagram of an embodiment of the simulation device for simulating a surface photo-voltage in a wafer operating in a photoconductive mode. A simulation device 150 includes a photodiode 102', a resistor 104', a disk 106', and an operational amplifier 157. The photodiode 102' includes an anode 108' and a cathode 110'. The resistor 104' includes a resistor first terminal 112' and a resistor second terminal 114'. The resistor first terminal 112' is in electrical communication with the photodiode anode 108'. In an alternative embodiment, the photodiode 102' can be inverted and the resistor first terminal 112' can be in electrical communication with the photodiode anode 110'. The disk 106' includes a first surface 116' and a second surface 118'. The disk first surface 116' is in electrical communication with the photodiode cathode 110'. The operational amplifier 157 includes an operational amplifier first input terminal 182, an operational amplifier second input terminal 184, and an operational amplifier output terminal 170. The operational amplifier first input terminal 182 is in electrical communication with the photodiode anode 108'. The operational amplifier second input terminal 184 is in electrical communication with the the photodiode cathode 110'. The operational amplifier output terminal 170 is in electrical communication with the resistor second terminal 114'. Light 122' from light source 120' is illuminated on the photodiode 102' to generate a surface photo-voltage. The disk second surface 118' of simulation device 150 would be placed on the measurement chuck 6 of the surface photo-voltage measurement device 2 shown in FIG. 1 to calibrate the surface photo-voltage measurement device 2.

Again optionally, an optical window 126' can be placed between the light source 120' and the photodiode 102'. The optical window 126' includes a polished quartz substrate 128' and an electrically conductive, optically transparent, coating 130'. For example, Indium-Tin-Oxide can be the electrically conductive optically transparent coating 130'. The optical window 126' can be used to filter the light 122' to the photodiode 102'. The electrically conductive, optically transparent coating 130' is in electrical communication with the resistor second terminal 114'.

Figure 6:
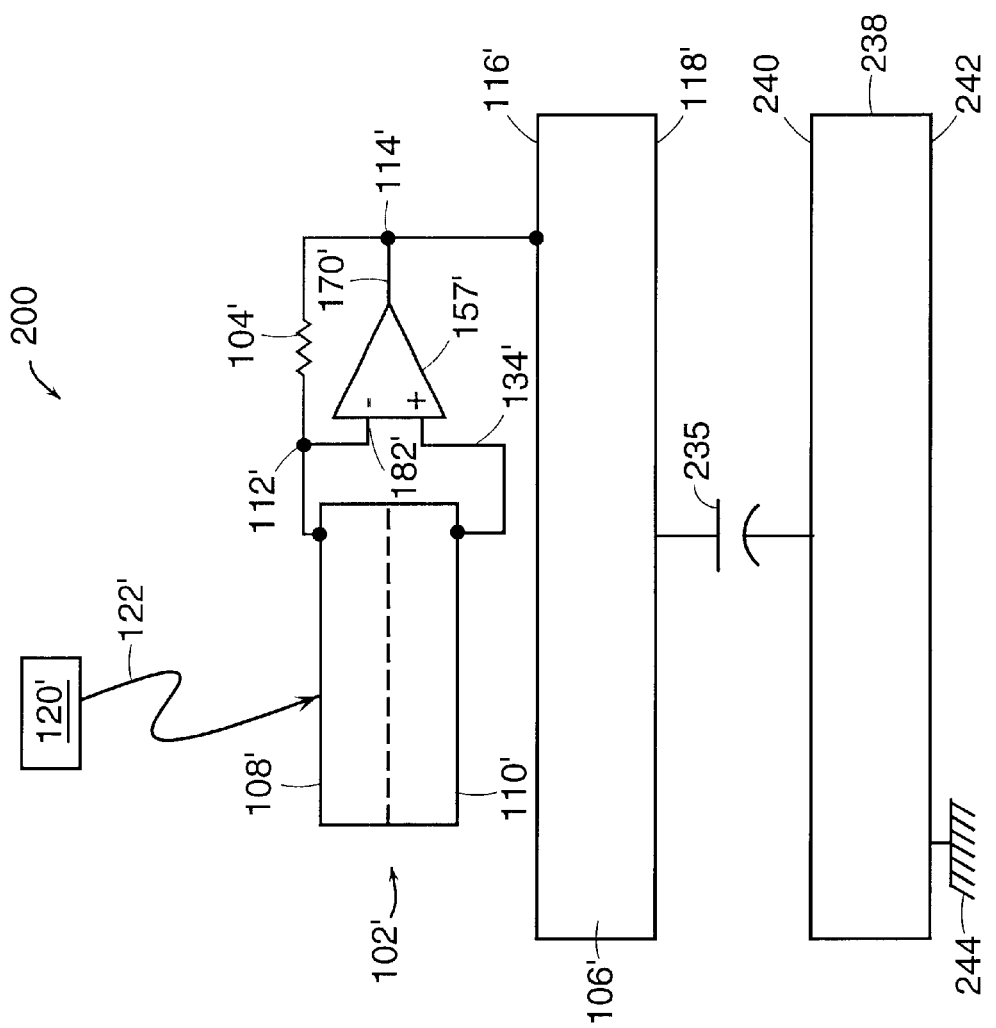
FIG. 6 is a schematic diagram of another embodiment of the simulation device.

FIG. 6 is a schematic diagram of another embodiment of the simulation device for simulating surface photo-voltage in a wafer operating in a photoconductive mode. A simulation device 200 includes a photodiode 102', a resistor 104', a disk 106', and an operational amplifier 157'. The photodiode 102' includes an anode 108' and a cathode 110'. The resistor 104' includes a resistor first terminal 112' and a resistor second terminal 114'. The resistor first terminal 112' is in electrical communication with the photodiode anode 108'. In an alternative embodiment the photodiode 102' can be inverted and the resistor first terminal 112' can be in electrical communication with the photodiode cathode 110'. The operational amplifier 157' includes an operational amplifier first input terminal 182', an operational amplifier second input terminal 134', and an operational amplifier output terminal 170'. The operational amplifier first input terminal 182' is in electrical communication with the photodiode anode 108'. The operational amplifier second input terminal 134' is in electrical communication with the photodiode cathode 110'. The operational amplifier output terminal 170' is in electrical communication with the resistor second terminal 114'. Light 122' from light source 120' is illuminated on the photodiode 102' to generate a surface photo-voltage. The disk 106' includes a first surface 116' and a second surface 118'. The disk first surface 116' is used to ground the output of the operational amplifier output terminal 170'. A measurement chuck 238 includes a first surface 240 and a second surface 242. An equivalent capacitor 235 is formed by the disk second surface 118' and the measurement chuck first surface 240. The measurement chuck second surface 242 is attached to a measurement chuck ground 244 that grounds the operating amplifier output terminal 170' through the equivalent capacitor 235. The grounding of the operating amplifier output terminal 170' results in a voltage drop across the resistor 104' and drives the input side of the circuit of FIG. 6 into common-mode. Thus, the surface photo-voltage appears as a common-mode signal on both sides of the photodiode with respect to the measurement chuck ground 244.

Figure 7:
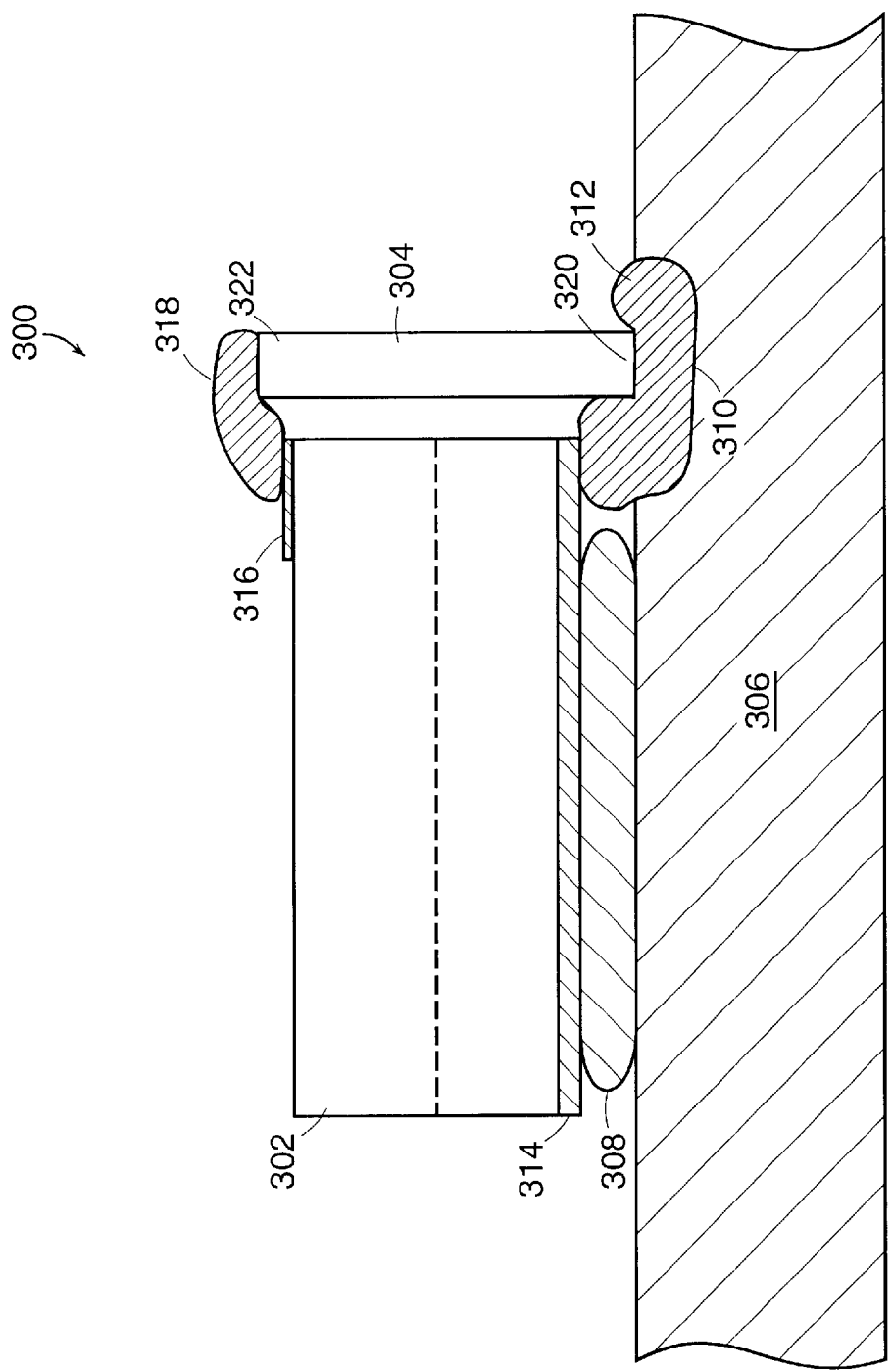
FIG. 7 is a cross section view of an embodiment of the simulation device illustrating a photodiode, a resistor, and a disk.

FIG. 7 is a cross-sectional view of an embodiment of the apparatus 300 for simulating a surface photo-voltage in a semiconductor wafer illustrating a photodiode 302, a resistor 304, and a disk 306. The resistor 304 includes a first terminal 320 and a second terminal 322. In one embodiment the photodiode 302 is a planar silicon PN type VTS2080 from E.G. & G. Vactec, St. Louis, Mo. 63132, in raw die form. The photodiode is attached to the disk 306 with an optical epoxy 308 which in one embodiment is an EPO-TEK 377 from Epoxy Technology Inc., Billerica, Mass. 01821. A small trench 310 is formed in the disk 306 to define an area to place the resistor first terminal 320. The mechanical action of forming the trench 310 improves the quality of the electrical contact with the disk 306. A conductive epoxy 312 is used for electrical connections in one embodiment. In one embodiment Epoxy Technologies, Inc. conductive silver epoxy type EPO-TEK H31D is used. The conductive epoxy 312 in the trench 310 also contacts a cathode metallization layer 314 of the photodiode 302, and the resistor first terminal 320 completing the lower node of the electrical circuit. A separate application of silver epoxy 318 is also used to attach the resistor second terminal 322 to an anode metallization 316 on the top surface of the photodiode 302. In one embodiment the resistor 302 is a standard surface mount 50 k ohm 0805 precision metal film such as ERA-3YE.

Figure 8:
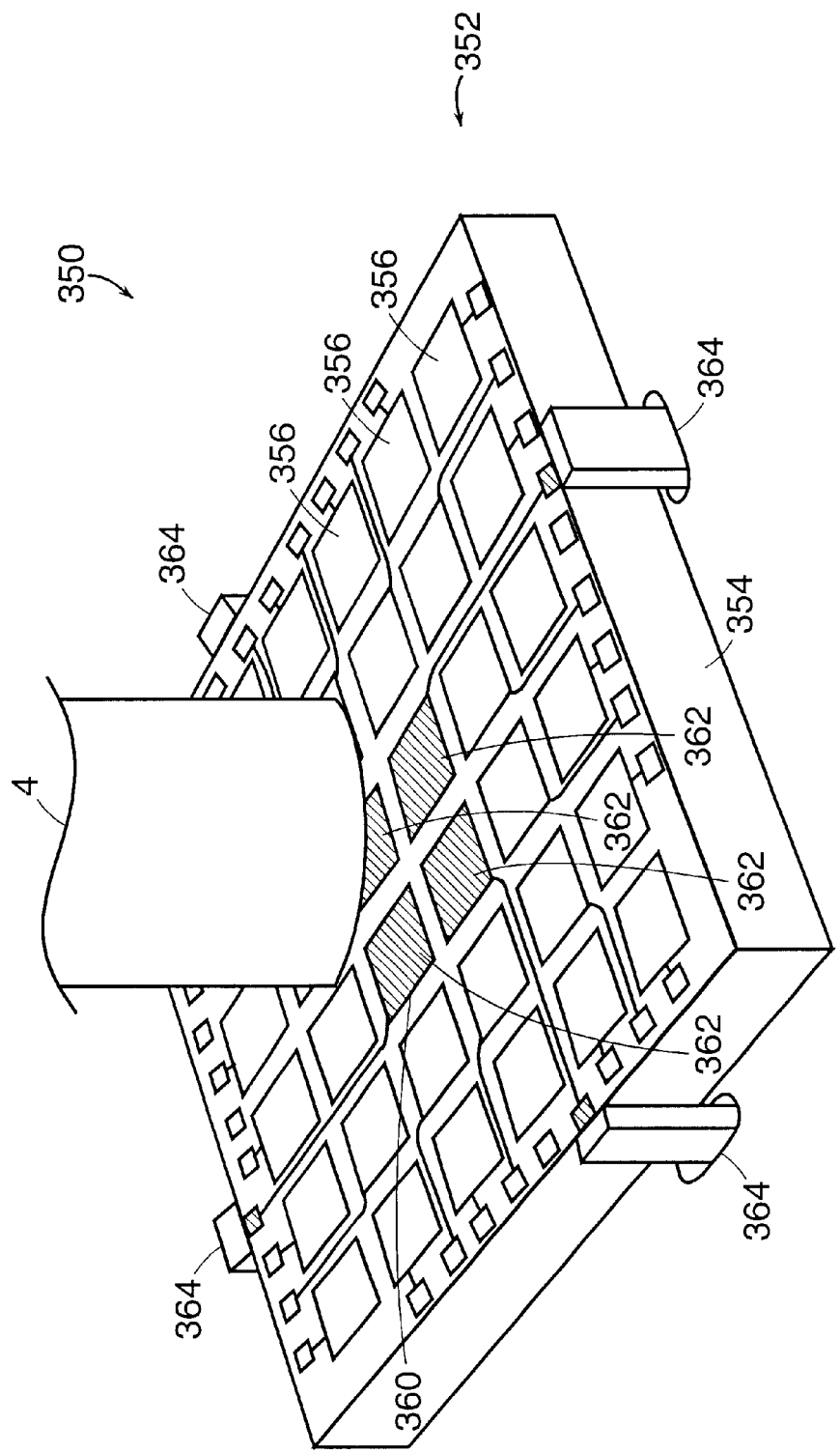
FIG. 8 is a perspective view of an embodiment of the apparatus for measuring a simulated surface photo-voltage using a simulation device of the present invention.

FIG. 8 is a perspective view of an embodiment of the apparatus 350 for measuring a simulated surface photo-voltage. The apparatus 350 includes a surface photo-voltage measurement probe 4', and a segmented photodiode 354. The segmented photodiode 354 is divided into a number of identical smaller segments 356. The surface photo-voltage measurement probe 348 illuminates only a small portion 362 of the total area of the segmented photodiode 354 as indicated in FIG. 8. The benefit of the segmented photodiode 354 is the surface photo-voltage signal generated by these illuminated segments 362 is not loaded down by the junction capacitance or leakage resistance of the non-illuminated segments 356, owing to the fact that each individual photodiode segment is electrically isolated from all of the other segments. All of the segments expected to be illuminated are electrically shunted by external resistors 364 to tailor their simulated surface photo-voltage signals to the measurement system being calibrated.

Variations, modifications, and other implementations of what is described herein will occur to those of ordinary skill in the art without departing from the spirit and the scope of the invention as claimed. Accordingly, the invention is to be defined not by the preceding illustrative description, but instead by the following claims.

What is claimed is:

1. An apparatus for simulating a surface photo-voltage in a semiconductor wafer, the apparatus comprising:
    a) a photodiode comprising an anode and a cathode;
    b) a resistor comprising a first terminal and a second terminal, wherein the resistor first terminal is in electrical communication with one of the photodiode anode and cathode; and
    c) a disk comprising a first surface and a second surface, wherein the resistor second terminal and the other of photodiode anode and cathode are in electrical communication with the disk first surface.

2. The apparatus of claim 1 wherein the disk is a conductive wafer.

3. The apparatus of claim 1 wherein the disk is a semiconductor wafer.

4. The apparatus of claim 1 wherein the disk is a process sized disk.

5. The apparatus of claim 1 wherein the photodiode is a planar photodiode.

6. The apparatus of claim 1 wherein the photodiode is a photodiode array comprising a plurality of individual photodiode segments.

7. The apparatus of claim 6 wherein one or more of the plurality of individual photodiode segments are in electrical communication with one or more external resistors.

8. The apparatus of claim 1 further comprising an optical window comprising an electrically conductive transparent coating positioned adjacent to the photodiode, wherein the electrically conductive transparent coating is in electrical communication with the resistor first terminal.

9. The apparatus of claim 1 further comprising an operational amplifier comprising an operational amplifier first input terminal, an operational amplifier second input terminal and an operational amplifier output terminal, wherein the operational amplifier first input terminal is in electrical communication with one of the photodiode anode and cathode, the operational amplifier second input terminal is in electrical communication with the other of the photodiode anode and cathode, and the operational amplifier output terminal is in electrical communication with the resistor second terminal.

10. The apparatus of claim 9 further comprising an optical window comprising an electrically conductive transparent coating positioned adjacent to the photodiode wherein the resistor second terminal is in electrical communication with the electrically conductive transparent coating.

11. An apparatus for measuring a simulated surface photo-voltage, the apparatus comprising:
   a) a simulator disk comprising:
      i) photodiode comprising an anode and a cathode;
      ii) a resistor comprising a resistor first terminal and a resistor second terminal, wherein the resistor first terminal is in electrical communication with one of the photodiode anode and cathode; and
      iii) a disk comprising a first surface and a second surface; wherein the resistor second terminal and the other of photodiode anode and cathode are in electrical communication with the disk first surface;
   b) a measurement chuck comprising a first surface, wherein the measurement chuck first surface is in electrical communication with the disk second surface;
   c) a light source; and
   d) a surface photo-voltage measurement probe positioned adjacent to the photodiode anode.

12. The apparatus of claim 11 wherein the disk is a conductive wafer.

13. The apparatus of claim 11 wherein the disk is a semiconductor wafer.

14. The apparatus of claim 11 wherein the disk is a process sized disk.

15. The apparatus of claim 11 wherein the photodiode is a planar photodiode.

16. The apparatus of claim 11 wherein the photodiode is a photodiode array comprising a plurality of individual photodiode segments.

17. The apparatus of claim 16 wherein one or more of the plurality of individual photodiode segments are in electrical communication with one or more external resistors.

18. The apparatus of claim 11 further comprising an optical window comprising an electrically conductive transparent coating positioned adjacent to the photodiode and between the photodiode and the light source, wherein the electrically conductive transparent coating is in electrical communication with the resistor first terminal.

19. The apparatus of claim 11 further comprising an operational amplifier comprising an operational amplifier first input terminal, an operational amplifier second input terminal and an operational amplifier output terminal, wherein the operational amplifier first input terminal is in electrical communication with one of the photodiode anode and cathode, the operational amplifier second input terminal is in electrical communication with the other of the photodiode anode and cathode, and the operational amplifier output terminal is in electrical communication with the resistor second terminal.

20. The apparatus of claim 19 further comprising an optical window comprising an electrically conductive transparent coating positioned adjacent to the photodiode wherein the resistor second terminal is in electrical communication with the electrically conductive transparent coating.

21. The apparatus of claim 11 wherein the light source generates a light comprising amplitude modulation.

22. A method for simulating a surface photo-voltage in a semiconductor wafer, the method comprising the steps of:
   a) providing an apparatus for generating a simulated surface photo-voltage, the apparatus comprising:
      i) a simulator disk comprising:
         (1) a photodiode comprising an anode and a cathode;
         (2) a resistor comprising a first terminal and a second terminal, wherein the resistor first terminal is in electrical communication with the photodiode anode;
         (3) a disk comprising a first surface and a second surface; wherein the resistor second terminal and the photodiode cathode are in electrical communication with the disk first surface; and
      ii) a light source;
   b) generating a light from the light source;
   c) illuminating the simulator disk with the light from the light source; and
   d) generating a signal in response to the light from the light source in the simulator disk.

23. The method of claim 22 wherein the simulator disk further comprises an operational amplifier comprising an operational amplifier first input terminal, an operational amplifier second input terminal and an operational amplifier output terminal, wherein the operational amplifier first input terminal is in electrical communication with one of the photodiode anode and cathode, the operational amplifier second input terminal is in electrical communication with the other of the photodiode anode and cathode, and the operational amplifier output terminal is in electrical communication with the resistor second terminal.

24. The method of claim 22 further comprising the steps of:
   a) providing a measurement chuck comprising a first surface, wherein the measurement chuck first surface is in electrical communication with the disk second surface;
   b) providing a surface photo-voltage measurement probe positioned adjacent to the photodiode anode; and
   c) measuring the signal with the surface photo-voltage measurement probe.

25. The method of claim 22 further comprising:
   a) providing a filter positioned between the photodiode and the light source; and
   b) filtering the light from the light source.

26. An apparatus for simulating a surface photo-voltage in a semiconductor wafer, the apparatus comprising:
   a) a photodiode comprising an anode metalization and a cathode metalization;
   b) a disk having a trench therein, wherein the disk is attached to the photodiode with an optical epoxy;
   c) a resistor comprising two terminals wherein, the resistor first terminal is attached to the trench and the photodiode cathode metalization with a first volume of conductive epoxy, and the resistor second terminal is attached to the photodiode anode metalization with a second volume of conductive epoxy.

27. An apparatus for simulating a surface photo-voltage in a semiconductor wafer, the apparatus comprising:
   a) a photodiode comprising an anode and a cathode;
   b) a resistor comprising a first terminal and a second terminal, wherein the resistor first terminal is in electrical communication with one of the photodiode anode and cathode;

c) an operational amplifier comprising an operational amplifier first input terminal, an operational amplifier second input terminal and an operational amplifier output terminal, wherein the operational amplifier first input terminal is in electrical communication with one of the photodiode anode and cathode, the operational amplifier second input terminal is in electrical communication with the other of the photodiode anode or cathode and the resistor first terminal, and the operational amplifier output terminal is in electrical communication with the resistor second terminal; and d) a disk comprising a first surface, wherein the photodiode is mounted on the disk but not in electrical communication with the disk.

* * * * *